(12) United States Patent
Li et al.

(10) Patent No.: US 10,943,935 B2
(45) Date of Patent: Mar. 9, 2021

(54) METHODS FOR TRANSFERRING CHARGE IN AN IMAGE SENSOR

(71) Applicant: Apple Inc., Cupertino, CA (US)

(72) Inventors: Xiangli Li, Palo Alto, CA (US);
Xiaofeng Fan, San Jose, CA (US);
Chung Chun Wan, Fremont, CA (US)

(73) Assignee: Apple Inc., Cupertino, CA (US)

( * ) Notice: Subject to any disclaimer, the term of this patent is extended or adjusted under 35 U.S.C. 154(b) by 468 days.

(21) Appl. No.: 15/682,255

(22) Filed: Aug. 21, 2017

(65) Prior Publication Data

US 2017/0373106 A1    Dec. 28, 2017

Related U.S. Application Data

(63) Continuation of application No. 13/787,094, filed on Mar. 6, 2013, now Pat. No. 9,741,754.

(51) Int. Cl.
*H01L 27/146* (2006.01)
*H04N 5/378* (2011.01)
(Continued)

(52) U.S. Cl.
CPC .. *H01L 27/14609* (2013.01); *H01L 27/14616* (2013.01); *H04N 5/35572* (2013.01);
(Continued)

(58) Field of Classification Search
CPC ........ H01L 27/14609; H01L 27/14616; H04N 5/379; H04N 5/37452; H04N 5/35572; H04N 5/378
See application file for complete search history.

(56) References Cited

U.S. PATENT DOCUMENTS

| 4,686,572 A | 8/1987 | Takatsu |
| 4,686,648 A | 8/1987 | Fossum |

(Continued)

FOREIGN PATENT DOCUMENTS

| CN | 1630350 | 6/2005 |
| CN | 1774032 | 5/2006 |

(Continued)

OTHER PUBLICATIONS

Jahromi et al., "A Single Chip Laser Radar Receiver with a 9×9 SPAD Detector Array and a 10-channel TDC," 2013 Proceedings of the ESSCIRC, IEEE, Sep. 14, 2015, pp. 364-367.

(Continued)

*Primary Examiner* — Jennifer D Bennett
(74) *Attorney, Agent, or Firm* — Brownstein Hyatt Farber Schreck, LLP

(57) ABSTRACT

Apparatuses and methods for charge transfer in image sensors are disclosed. One example of an image sensor pixel may include a first charge storage node and a second charge storage node. A transfer circuit may be coupled between the first and second charge storage nodes, and the transfer circuit may have a first region proximate the first charge storage node and configured to have a first potential. The transfer circuit may also have a second region proximate the second charge storage node configured to have a second, higher potential. An input node may be configured to control the first and second potentials based on a transfer signal provided to the input node.

12 Claims, 8 Drawing Sheets

(51) Int. Cl.
*H04N 5/355* (2011.01)
*H04N 5/3745* (2011.01)
*H04N 5/369* (2011.01)

(52) U.S. Cl.
CPC ............. *H04N 5/378* (2013.01); *H04N 5/379* (2018.08); *H04N 5/37452* (2013.01)

(56) References Cited

U.S. PATENT DOCUMENTS

| | | | |
|---|---|---|---|
| 5,105,264 A | 4/1992 | Erhardt et al. | |
| 5,329,313 A | 7/1994 | Keith | |
| 5,396,893 A | 3/1995 | Oberg et al. | |
| 5,471,515 A | 11/1995 | Fossum et al. | |
| 5,541,402 A | 7/1996 | Ackland | |
| 5,550,677 A | 8/1996 | Schofield et al. | |
| 5,781,312 A | 7/1998 | Noda | |
| 5,841,126 A | 11/1998 | Fossum et al. | |
| 5,880,459 A | 3/1999 | Pryor et al. | |
| 5,949,483 A | 9/1999 | Fossum et al. | |
| 6,008,486 A | 12/1999 | Stam et al. | |
| 6,040,568 A | 3/2000 | Caulfield et al. | |
| 6,233,013 B1 | 5/2001 | Hosier et al. | |
| 6,348,929 B1 | 2/2002 | Acharya et al. | |
| 6,448,550 B1 | 9/2002 | Nishimura | |
| 6,528,833 B2 | 3/2003 | Lee et al. | |
| 6,541,751 B1 | 4/2003 | Bidermann | |
| 6,670,904 B1 | 12/2003 | Yakovlev | |
| 6,713,796 B1 | 3/2004 | Fox | |
| 6,714,239 B2 | 3/2004 | Guidash | |
| 6,798,453 B1 | 9/2004 | Kaifu | |
| 6,816,676 B2 | 11/2004 | Bianchi et al. | |
| 6,905,470 B2 | 6/2005 | Lee et al. | |
| 6,931,269 B2 | 8/2005 | Terry | |
| 6,956,605 B1 | 10/2005 | Hashimoto | |
| 6,982,759 B2 | 1/2006 | Goto | |
| 7,075,049 B2 | 7/2006 | Rhodes et al. | |
| 7,084,914 B2 | 8/2006 | Van Blerkom | |
| 7,091,466 B2 | 8/2006 | Bock | |
| 7,119,322 B2 | 10/2006 | Hong | |
| 7,133,073 B1 | 11/2006 | Neter | |
| 7,259,413 B2 | 8/2007 | Rhodes | |
| 7,262,401 B2 | 8/2007 | Hopper et al. | |
| 7,271,835 B2 | 9/2007 | Iizuka | |
| 7,282,028 B2 | 10/2007 | Kim et al. | |
| 7,319,218 B2 | 1/2008 | Krymski | |
| 7,332,786 B2 | 2/2008 | Altice | |
| 7,390,687 B2 | 6/2008 | Boettiger | |
| 7,415,096 B2 | 8/2008 | Sherman | |
| 7,437,013 B2 | 10/2008 | Anderson | |
| 7,443,421 B2 | 10/2008 | Stavely et al. | |
| 7,446,812 B2 | 11/2008 | Ando et al. | |
| 7,471,315 B2 | 12/2008 | Silsby et al. | |
| 7,502,054 B2 | 3/2009 | Kalapathy | |
| 7,525,168 B2 | 4/2009 | Hsieh | |
| 7,554,067 B2 | 6/2009 | Zarnoski et al. | |
| 7,555,158 B2 | 6/2009 | Park et al. | |
| 7,589,316 B2 | 9/2009 | Dunki-Jacobs | |
| 7,622,699 B2 | 11/2009 | Sakakibara et al. | |
| 7,626,626 B2 | 12/2009 | Panicacci | |
| 7,636,109 B2 | 12/2009 | Nakajima et al. | |
| 7,667,400 B1 | 2/2010 | Goushcha | |
| 7,671,435 B2 | 3/2010 | Ahn | |
| 7,714,292 B2 | 5/2010 | Agarwal et al. | |
| 7,728,351 B2 | 6/2010 | Shim | |
| 7,733,402 B2 | 6/2010 | Egawa et al. | |
| 7,742,090 B2 | 6/2010 | Street | |
| 7,764,312 B2 | 7/2010 | Ono et al. | |
| 7,773,138 B2 | 8/2010 | Lahav et al. | |
| 7,786,543 B2 | 8/2010 | Hsieh | |
| 7,796,171 B2 | 9/2010 | Gardner | |
| 7,817,198 B2 | 10/2010 | Kang et al. | |
| 7,838,956 B2 | 11/2010 | McCarten et al. | |
| 7,873,236 B2 | 1/2011 | Li et al. | |
| 7,880,785 B2 | 2/2011 | Gallagher | |
| 7,884,402 B2 | 2/2011 | Ki | |
| 7,906,826 B2 | 3/2011 | Martin et al. | |
| 7,952,121 B2 | 5/2011 | Arimoto | |
| 7,952,635 B2 | 5/2011 | Lauxtermann | |
| 7,982,789 B2 | 7/2011 | Watanabe et al. | |
| 8,026,966 B2 | 9/2011 | Altice | |
| 8,032,206 B1 | 10/2011 | Farazi et al. | |
| 8,089,036 B2 | 1/2012 | Manabe et al. | |
| 8,089,524 B2 | 1/2012 | Urisaka | |
| 8,094,232 B2 | 1/2012 | Kusaka | |
| 8,116,540 B2 | 2/2012 | Dean | |
| 8,140,143 B2 | 3/2012 | Picard et al. | |
| 8,153,947 B2 | 4/2012 | Barbier et al. | |
| 8,159,570 B2 | 4/2012 | Negishi | |
| 8,159,588 B2 | 4/2012 | Boemler | |
| 8,164,669 B2 | 4/2012 | Compton et al. | |
| 8,174,595 B2 | 5/2012 | Honda et al. | |
| 8,184,188 B2 | 5/2012 | Yaghmai | |
| 8,194,148 B2 | 6/2012 | Doida | |
| 8,194,165 B2 | 6/2012 | Border et al. | |
| 8,222,586 B2 | 7/2012 | Lee | |
| 8,227,844 B2 | 7/2012 | Adkisson | |
| 8,233,071 B2 | 7/2012 | Takeda | |
| 8,259,228 B2 | 9/2012 | Wei et al. | |
| 8,310,577 B1 | 11/2012 | Neter | |
| 8,324,553 B2 | 12/2012 | Lee | |
| 8,330,839 B2 | 12/2012 | Compton et al. | |
| 8,338,856 B2 | 12/2012 | Tai et al. | |
| 8,340,407 B2 | 12/2012 | Kalman | |
| 8,350,940 B2 | 1/2013 | Smith et al. | |
| 8,355,117 B2 | 1/2013 | Niclass | |
| 8,388,346 B2 | 3/2013 | Rantala et al. | |
| 8,400,546 B2 | 3/2013 | Itano et al. | |
| 8,456,540 B2 | 6/2013 | Egawa | |
| 8,456,559 B2 | 6/2013 | Yamashita | |
| 8,462,247 B2 * | 6/2013 | Kim | H04N 5/378 250/208.1 |
| 8,508,637 B2 | 8/2013 | Han et al. | |
| 8,514,308 B2 | 8/2013 | Itonaga et al. | |
| 8,520,913 B2 | 8/2013 | Dean | |
| 8,546,737 B2 | 10/2013 | Tian et al. | |
| 8,547,388 B2 | 10/2013 | Cheng | |
| 8,575,531 B2 | 11/2013 | Hynecek et al. | |
| 8,581,992 B2 | 11/2013 | Hamada | |
| 8,594,170 B2 | 11/2013 | Mombers et al. | |
| 8,619,163 B2 | 12/2013 | Ogua | |
| 8,619,170 B2 | 12/2013 | Mabuchi | |
| 8,629,484 B2 | 1/2014 | Ohri et al. | |
| 8,634,002 B2 | 1/2014 | Kita | |
| 8,637,875 B2 | 1/2014 | Finkelstein et al. | |
| 8,648,947 B2 | 2/2014 | Sato et al. | |
| 8,653,434 B2 | 2/2014 | Johnson et al. | |
| 8,723,975 B2 | 5/2014 | Solhusvik | |
| 8,724,096 B2 | 5/2014 | Gosch et al. | |
| 8,730,345 B2 | 5/2014 | Watanabe | |
| 8,754,983 B2 | 6/2014 | Sutton | |
| 8,755,854 B2 | 6/2014 | Addison et al. | |
| 8,759,736 B2 | 6/2014 | Yoo | |
| 8,760,413 B2 | 6/2014 | Peterson et al. | |
| 8,767,104 B2 | 7/2014 | Makino et al. | |
| 8,803,990 B2 | 8/2014 | Smith | |
| 8,810,703 B2 | 8/2014 | Mabuchi | |
| 8,817,154 B2 | 8/2014 | Manabe et al. | |
| 8,879,686 B2 | 11/2014 | Okada et al. | |
| 8,902,330 B2 | 12/2014 | Theuwissen | |
| 8,902,341 B2 | 12/2014 | Machida | |
| 8,908,073 B2 | 12/2014 | Minagawa | |
| 8,923,994 B2 | 12/2014 | Laikari et al. | |
| 8,934,030 B2 | 1/2015 | Kim et al. | |
| 8,936,552 B2 | 1/2015 | Kateraas et al. | |
| 8,946,610 B2 | 2/2015 | Iwabuchi et al. | |
| 8,982,237 B2 | 3/2015 | Chen | |
| 9,001,251 B2 | 4/2015 | Smith et al. | |
| 9,006,641 B2 | 4/2015 | Drader | |
| 9,041,837 B2 | 5/2015 | Li | |
| 9,017,748 B2 | 6/2015 | Theuwissen | |
| 9,054,009 B2 | 6/2015 | Oike et al. | |
| 9,058,081 B2 | 6/2015 | Baxter | |
| 9,066,017 B2 | 6/2015 | Geiss | |
| 9,066,660 B2 | 6/2015 | Watson et al. | |

(56) References Cited

U.S. PATENT DOCUMENTS

| | | |
|---|---|---|
| 9,088,727 B2 | 7/2015 | Trumbo |
| 9,094,623 B2 | 7/2015 | Kawaguchi |
| 9,099,604 B2 | 8/2015 | Roy |
| 9,100,597 B2 | 8/2015 | Hu |
| 9,106,859 B2 | 8/2015 | Kizuna et al. |
| 9,131,171 B2 | 9/2015 | Aoki et al. |
| 9,151,829 B2 | 10/2015 | Campbell |
| 9,154,750 B2 | 10/2015 | Pang |
| 9,160,949 B2 | 10/2015 | Zhang et al. |
| 9,164,144 B2 | 10/2015 | Dolinsky |
| 9,178,100 B2 | 11/2015 | Webster et al. |
| 9,209,320 B1 | 12/2015 | Webster |
| 9,225,948 B2 | 12/2015 | Hasegawa |
| 9,232,150 B2 | 1/2016 | Kleekajai et al. |
| 9,232,161 B2 | 1/2016 | Suh |
| 9,235,267 B2 | 1/2016 | Burrough et al. |
| 9,270,906 B2 | 2/2016 | Peng et al. |
| 9,276,031 B2 | 3/2016 | Wan |
| 9,277,144 B2 | 3/2016 | Kleekajai et al. |
| 9,287,304 B2 | 3/2016 | Park et al. |
| 9,288,380 B2 | 3/2016 | Nomura |
| 9,288,404 B2 | 3/2016 | Papiashvili |
| 9,293,500 B2 | 3/2016 | Sharma et al. |
| 9,312,401 B2 | 4/2016 | Webster |
| 9,313,434 B2 | 4/2016 | Dutton et al. |
| 9,319,611 B2 | 4/2016 | Fan |
| 9,331,116 B2 | 5/2016 | Webster |
| 9,344,649 B2 | 5/2016 | Bock |
| 9,380,245 B1 | 6/2016 | Guidash |
| 9,392,237 B2 | 7/2016 | Toyoda |
| 9,417,326 B2 | 8/2016 | Niclass et al. |
| 9,438,258 B1 | 9/2016 | Yoo |
| 9,445,018 B2 | 9/2016 | Fettig et al. |
| 9,448,110 B2 | 9/2016 | Wong |
| 9,451,887 B2 | 9/2016 | Watson et al. |
| 9,467,553 B2 | 10/2016 | Heo et al. |
| 9,473,706 B2 | 10/2016 | Malone et al. |
| 9,478,030 B1 | 10/2016 | Lecky |
| 9,479,688 B2 | 10/2016 | Ishii |
| 9,490,285 B2 | 11/2016 | Itonaga |
| 9,497,397 B1 | 11/2016 | Kleekajai et al. |
| 9,503,616 B2 | 11/2016 | Taniguchi et al. |
| 9,516,244 B2 | 12/2016 | Borowski |
| 9,521,337 B1 | 12/2016 | Shen |
| 9,538,067 B2 | 1/2017 | Hamada |
| 9,538,106 B2 | 1/2017 | McMahon et al. |
| 9,549,099 B2 | 1/2017 | Fan |
| 9,560,339 B2 | 1/2017 | Borowski |
| 9,584,743 B1 | 2/2017 | Lin et al. |
| 9,584,744 B2 | 2/2017 | Lenchenkov et al. |
| 9,596,420 B2 | 3/2017 | Fan et al. |
| 9,596,423 B1 | 3/2017 | Molgaard |
| 9,609,250 B2 | 3/2017 | Lee et al. |
| 9,639,063 B2 | 5/2017 | Dutton et al. |
| 9,661,210 B2 | 5/2017 | Haneda |
| 9,661,308 B1 | 5/2017 | Wang et al. |
| 9,666,618 B2 | 5/2017 | Meynants |
| 9,686,485 B2 | 6/2017 | Agranov et al. |
| 9,700,240 B2 | 7/2017 | Letchner et al. |
| 9,749,556 B2 | 8/2017 | Fettig et al. |
| 9,754,994 B2 | 9/2017 | Koo et al. |
| 9,774,318 B2 | 9/2017 | Song |
| 9,781,368 B2 | 10/2017 | Song |
| 9,819,890 B2 | 11/2017 | Wang et al. |
| 9,831,283 B2 | 11/2017 | Shepard et al. |
| 9,888,198 B2 | 2/2018 | Mauritzson et al. |
| 9,894,304 B1 | 2/2018 | Smith |
| 9,912,883 B1 | 3/2018 | Agranov et al. |
| 9,936,151 B2 | 4/2018 | Wang et al. |
| 9,952,323 B2 | 4/2018 | Deane |
| 10,104,318 B2 | 10/2018 | Smith et al. |
| 10,136,090 B2 | 11/2018 | Vogelsang et al. |
| 10,153,310 B2 | 12/2018 | Zhang et al. |
| 10,212,378 B2 | 2/2019 | Negishi |
| 10,249,660 B2 | 4/2019 | Guidash |
| 10,285,626 B1 | 5/2019 | Kestelli et al. |
| 10,306,167 B2 | 5/2019 | Shimasaki |
| 10,431,608 B2 | 10/2019 | Ebihara |
| 10,447,950 B2 | 10/2019 | Wang |
| 2002/0020863 A1* | 2/2002 | Lee ............... H01L 27/14609 257/292 |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0060897 A1* | 3/2006 | Kuwazawa ............ H04N 5/341 257/292 |
| 2006/0274161 A1 | 12/2006 | Ing et al. |
| 2007/0023801 A1* | 2/2007 | Hynecek ............ H01L 27/1463 257/292 |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0201400 A1 | 8/2009 | Zhang et al. |
| 2009/0219266 A1 | 9/2009 | Lim et al. |
| 2010/0110018 A1 | 5/2010 | Faubert et al. |
| 2010/0134631 A1 | 6/2010 | Voth |
| 2011/0080500 A1 | 4/2011 | Wang et al. |
| 2011/0156197 A1 | 6/2011 | Tivarus et al. |
| 2011/0164162 A1 | 7/2011 | Kato |
| 2011/0193824 A1 | 8/2011 | Modarres et al. |
| 2012/0092541 A1 | 4/2012 | Tuulos et al. |
| 2012/0098964 A1 | 4/2012 | Oggier et al. |
| 2012/0127084 A1 | 5/2012 | Pance et al. |
| 2012/0162632 A1 | 6/2012 | Dutton |
| 2012/0273654 A1* | 11/2012 | Hynecek ............ H01L 27/1464 250/208.1 |
| 2013/0147981 A1 | 6/2013 | Wu |
| 2014/0049683 A1 | 2/2014 | Guenter |
| 2014/0071321 A1 | 3/2014 | Seyama |
| 2014/0132528 A1 | 5/2014 | Catton |
| 2014/0231630 A1 | 8/2014 | Rae et al. |
| 2015/0062391 A1 | 3/2015 | Murata |
| 2015/0277559 A1 | 10/2015 | Vescovi et al. |
| 2015/0312479 A1 | 10/2015 | McMahon et al. |
| 2016/0050379 A1 | 2/2016 | Jiang et al. |
| 2016/0099371 A1 | 4/2016 | Webster |
| 2016/0205311 A1 | 7/2016 | Mandelli et al. |
| 2016/0218236 A1 | 7/2016 | Dhulla et al. |
| 2016/0219232 A1 | 7/2016 | Murata |
| 2016/0274237 A1 | 9/2016 | Stutz |
| 2016/0307325 A1 | 10/2016 | Wang et al. |
| 2016/0344920 A1 | 11/2016 | Iwahara |
| 2016/0356890 A1 | 12/2016 | Fried et al. |
| 2016/0365380 A1 | 12/2016 | Wan |
| 2017/0047363 A1 | 2/2017 | Choi et al. |
| 2017/0052065 A1 | 2/2017 | Sharma et al. |
| 2017/0082746 A1 | 3/2017 | Kubota et al. |
| 2017/0084133 A1 | 3/2017 | Cardinali et al. |
| 2017/0142325 A1 | 5/2017 | Shimokawa et al. |
| 2017/0170229 A1 | 6/2017 | Oh et al. |
| 2017/0223292 A1 | 8/2017 | Ikeda |
| 2017/0272675 A1 | 9/2017 | Kobayashi |
| 2017/0364736 A1 | 12/2017 | Ollila |
| 2018/0090526 A1 | 3/2018 | Mandai et al. |
| 2018/0090536 A1 | 3/2018 | Mandai et al. |
| 2018/0109742 A1 | 4/2018 | Agranov et al. |
| 2018/0209846 A1 | 7/2018 | Mandai et al. |
| 2018/0213205 A1 | 7/2018 | Oh |
| 2019/0018119 A1 | 1/2019 | Laifenfeld et al. |
| 2019/0027674 A1 | 1/2019 | Zhang et al. |
| 2020/0029035 A1 | 1/2020 | Agranov et al. |
| 2020/0029043 A1 | 1/2020 | McMahon |

FOREIGN PATENT DOCUMENTS

| | | |
|---|---|---|
| CN | 1833429 | 9/2006 |
| CN | 1842138 | 10/2006 |
| CN | 1947414 | 4/2007 |
| CN | 101189885 | 5/2008 |
| CN | 101221965 | 7/2008 |

(56) References Cited

FOREIGN PATENT DOCUMENTS

| | | |
|---|---|---|
| CN | 101233763 | 7/2008 |
| CN | 101472059 | 7/2009 |
| CN | 101567977 | 10/2009 |
| CN | 101622859 | 1/2010 |
| CN | 101739955 | 6/2010 |
| CN | 101754029 | 6/2010 |
| CN | 101803925 | 8/2010 |
| CN | 102036020 | 4/2011 |
| CN | 102067584 | 5/2011 |
| CN | 102208423 | 10/2011 |
| CN | 102451160 | 5/2012 |
| CN | 102668542 | 9/2012 |
| CN | 102820309 | 12/2012 |
| CN | 102821255 | 12/2012 |
| CN | 103024297 | 4/2013 |
| CN | 103051843 | 4/2013 |
| CN | 103329513 | 9/2013 |
| CN | 103546702 | 1/2014 |
| CN | 104041009 | 9/2014 |
| CN | 104052919 | 9/2014 |
| CN | 204761615 | 11/2015 |
| CN | 205211754 | 5/2016 |
| DE | 102010060527 | 4/2012 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| EP | 2787531 | 10/2014 |
| JP | S61123287 | 6/1986 |
| JP | 2007504670 | 8/1987 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 201149697 | 3/2011 |
| JP | 2011091775 | 5/2011 |
| JP | 11-216970 | 10/2011 |
| JP | 11-217315 | 10/2011 |
| JP | 2011097646 | 12/2011 |
| JP | 2012010306 | 1/2012 |
| JP | 2012019516 | 1/2012 |
| JP | 2012513160 | 6/2012 |
| JP | 2013005397 | 1/2013 |
| JP | 2013051523 | 3/2013 |
| JP | 2013070240 | 4/2013 |
| JP | 2013529035 | 7/2013 |
| JP | 2014081254 | 5/2014 |
| JP | 2016145776 | 8/2016 |
| KR | 20030034424 | 5/2003 |
| KR | 20030061157 | 7/2003 |
| KR | 20050103732 | 11/2005 |
| KR | 2008/0069851 | 7/2008 |
| KR | 20100008239 | 1/2010 |
| KR | 20100065084 | 6/2010 |
| KR | 20130074459 | 7/2013 |
| TW | 200520551 | 6/2005 |
| TW | 200803481 | 1/2008 |
| TW | 201110689 | 3/2011 |
| TW | 201301881 | 1/2013 |
| WO | WO 05/041304 | 5/2005 |
| WO | WO 06/014641 | 2/2006 |
| WO | WO 06/130443 | 12/2006 |
| WO | WO 07/049900 | 5/2007 |
| WO | WO 10/120945 | 10/2010 |
| WO | WO 12/011095 | 1/2012 |
| WO | WO 12/032353 | 3/2012 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |
| WO | WO 17/112416 | 6/2017 |

OTHER PUBLICATIONS

U.S. Appl. No. 15/879,365, filed Jan. 24, 2018, Mandai et al.
U.S. Appl. No. 15/879,350, filed Jan. 24, 2018, Mandai et al.
U.S. Appl. No. 15/880,285, filed Jan. 25, 2018, Laifenfeld et al.
U.S. Appl. No. 16/226,491, filed Dec. 19, 2018, McMahon.
Shen et al., "Stresses, Curvatures, and Shape Changes Arising from Patterned Lines on Silicon Wafers," Journal of Applied Physics, vol. 80, No. 3, Aug. 1996, pp. 1388-1398.
U.S. Appl. No. 15/699,806, filed Sep. 8, 2017, Li et al.
U.S. Appl. No. 15/713,477, filed Sep. 22, 2017, Mandai et al.
U.S. Appl. No. 15/713,520, filed Sep. 22, 2017, Mandai et al.
U.S. Appl. No. 16/460,883, filed Jul. 2, 2019, Agranov et al.
Charbon, et al., SPAD-Based Sensors, *TOF Range-Imaging Cameras*, F. Remondino and D. Stoppa (eds.), 2013, Springer-Verlag Berlin Heidelberg, pp. 11-38.
Cox, "Getting histograms with varying bin widths," http://www.stata.com/support/faqs/graphics/histograms-with-varying-bin-widths/, Nov. 13, 2017, 5 pages.
Gallivanoni, et al., "Progress n Quenching Circuits for Single Photon Avalanche Diodes," IEEE Transactions on Nuclear Science, vol. 57, No. 6, Dec. 2010, pp. 3815-3826.
Leslar, et al., "Comprehensive Utilization of Temporal and Spatial Domain Outlier Detection Methods for Mobile Terrestrial LiDAR Data," Remote Sensing, 2011, vol. 3, pp. 1724-1742.
Mota, et al., "A flexible multi-channel high-resolution Time-to-Digital Converter ASIC," *Nuclear Science Symposium Conference Record IEEE*, 2000, Engineering School of Geneva, Microelectronics Lab, Geneva, Switzerland, 8 pages.
Niclass, et al., "Design and Characterization of a CMOS 3-D Image Sensor Based on Single Photon Avalanche Diodes," *IEEE Journal of Solid-State Circuits*, vol. 40, No. 9, Sep. 2005, pp. 1847-1854.
Shin, et al., "Photon-Efficient Computational 3D and Reflectivity Imaging with Single-Photon Detectors," IEEE International Conference on Image Processing, Paris, France, Oct. 2014, 11 pages.
Tisa, et al., "Variable-Load Quenching Circuit for single-photon avalanche diodes," Optics Express, vol. 16, No. 3, Feb. 4, 2008, pp. 2232-2244.
Ullrich, et al., "Linear LIDAR versus Geiger-mode LIDAR: Impact on data properties and data quality," *Laser Radar Technology and Applications XXI*, edited by Monte D. Turner, Gary W. Kamerman, Proc. of SPIE, vol. 9832, 983204, 2016, 17 pages.
Aoki, et al., "Rolling-Shutter Distortion-Free 3D Stacked Image Sensor with −160db Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.
Elgendi, "On the Analysis of Fingertip Photoplethysmogram Signals," *Current Cardiology Reviews*, 2012, vol. 8, pp. 14-25.
Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.
Fu, et al., "Heart Rate Extraction from Photoplethysmogram Waveform Using Wavelet Multui-resolution Analysis," *Journal of Medical and Biological Engineering*, 2008, vol. 28, No. 4, pp. 229-232.
Han, et al., "Artifacts in wearable photoplethysmographs during daily life motions and their reduction with least mean square based active noise cancellation method," *Computers in Biology and Medicine*, 2012, vol. 42, pp. 387-393.

(56) References Cited

OTHER PUBLICATIONS

Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.
Santos, et al., "Accelerometer-assisted PPG Measurement During Physical Exercise Using the LAVIMO Sensor System," *Acta Polytechnica*, 2012, vol. 52, No. 5, pp. 80-85.
Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.
Schwarzer, et al., On the determination of film stress from substrate bending: STONEY'S formula and its limits, Jan. 2006, 19 pages.
Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.

\* cited by examiner

METHODS FOR TRANSFERRING CHARGE IN AN IMAGE SENSOR

CROSS-REFERENCE TO RELATED APPLICATIONS

This application is a continuation of U.S. Nonprovisional patent application Ser. No. 13/787,094, filed Mar. 6, 2013, the disclosures of which are hereby incorporated herein by reference in their entirety.

TECHNICAL FIELD

The present invention relates generally to image sensors, and, more specifically, to charge transfer in image sensors.

BACKGROUND

In image sensors, charge frequently needs to be transferred between a plurality of different nodes. For example, in a global shutter complementary metal oxide semiconductor (CMOS) image sensor, charge accumulated in a photodiode from incident photons may need to be transferred from the photodiode to a storage node, and then, subsequently, to a floating diffusion node for global shutter read out.

In order to accomplish the charge transfer from one node to another node, the nodes are frequently designed such that during operation, the node to which the charge is to be transferred (i.e., the destination node) has a greater electric potential than the node from which the charge is to be transferred (i.e., the source node). A transistor may be coupled between the two nodes, with the transistor controlling the electric potential of a region between the nodes such that a barrier can be created and removed responsive to a transfer signal provided to the transistor's input gate. When the barrier between two nodes is removed, the charge typically flows to the node with the higher potential until that node is "full," and any remaining charge may spill back into the other node. Thus, in order to fully transfer charge from one node to another, the destination node may need to have a potential that is greater than the potential of the source node by an amount equal to or exceeding the amount of charge to be transferred. In other words, the destination node may need to have sufficient well capacity to hold the charge from the source node without sharing the charge back with the source node when the barrier between the nodes is removed. In order to achieve full charge transfer between a plurality of nodes, the electric potential is thus increased for successive nodes, with the increase in electric potential between each successive node generally equaling or exceeding the full well capacity for the pixel.

Increasing the potential for each successive node, however, typically requires higher power supply voltages to be provided to the image sensor. The higher power supply voltage may result in higher power consumption, may require specialized processes to manufacture, and/or may require mitigation of electrostatic discharge issues. Alternatively, rather than using higher power supply voltages to obtain the higher potentials for each successive node, the conversion gain between nodes may be reduced. Reducing the conversion gain, however, may result in more noise and less sensitivity in operation of the image sensor.

Some recent improvements in image sensor pixel design include additional nodes in image sensor pixels—for example, an image sensor formed by having two or more silicon chips stacked together. The interconnections between the silicon chips may require additional contacts and storage nodes for charge to be transferred between the silicon chips. The additional nodes exacerbate the need to increase the potential of subsequent storage nodes.

SUMMARY

One example of the present disclosure may take the form of an image sensor pixel. The image sensor pixel may include a first charge storage node and a second charge storage node. A transfer circuit may be coupled between the first and second charge storage nodes, with the transfer circuit having a first region proximate the first charge storage node and configured to have a first potential. The transfer circuit may also have a second region proximate the second charge storage node configured to have a second, higher potential. An input node may be configured to control the first and second potentials based on a transfer signal provided to the input node.

Another example of the present disclosure may take the form of an integrated circuit with a first node configured to store charge and a second node coupled to the first node and configured to receive charge from the first node. The integrated circuit may also include a transfer circuit coupling the first node to the second node. The transfer circuit may include a storage region with a first variable potential configured to be controlled by a transfer signal and a barrier with a second variable potential is also configured to be controlled by the transfer signal.

Another example of the present disclosure may take the form of a method of transferring charge from a first node with a first electric potential to a second node with a second electric potential in an image sensor pixel. The method may include increasing, responsive to a transfer signal, a third electric potential of a barrier proximate the first node such that the third electric potential is greater than the first electric potential. The method may further include increasing, responsive to the transfer signal, a fourth electric potential of a storage region coupled between the barrier and the second node such that the fourth electric potential is greater than the third electric potential. The method may also include decreasing, responsive to the transfer signal, the fourth electric potential of the storage region such that the fourth electric potential is less than the second electric potential.

SPECIFICATION

Overview

In some embodiments disclosed herein, apparatuses and methods for transferring charge from one node of an image sensor pixel to another node of the image sensor pixel are disclosed. Typically, charge transfer between nodes in image sensors is effectuated using nodes with different potentials separated by transfer gates. For charge to move from one node to another, the potential of the destination node needs to be greater than the potential of the source node. The transfer gate may be turned on, which causes the charge to "fall" to the node with a higher potential, much like water poured from a pitcher falls to a glass as a result of gravity acting on the water. For image sensors where charge needs to be serially transferred along more than 2 nodes, this operation can be challenging due to the need to continue increasing the potential for each subsequent node/region.

Therefore, in this disclosure, one transfer gate between two nodes is modified to create a mechanism to transfer charge from one node to another without needing a greatly increased potential in the destination node. One example where this may be particularly useful is for charge transfer among a plurality of nodes in a stacked-die image sensor, although the disclosure is not limited to this example. The modified transfer gate includes two differently doped regions—with the region closest to the destination node having a potential that is greater than the potential of the region closest the origination node, thus forming a variable barrier and a mini-storage region, both under the transfer gate. A virtual barrier is also formed between the transfer gate and the destination node. The potentials of the variable barrier and the mini-storage region are controlled in part by the voltage applied to the transfer gate. As the voltage applied to the transfer gate increases, the potentials of the barrier and the mini-storage region also increase so that some of the charge from the source node flows into the mini-storage region. Then, the voltage applied to the transfer gate is decreased so that the charge in the mini-storage region flows into the destination node. Several iterations may be required as the mini-well may only transfer a portion of the total charge in each cycle.

Figure 1A:
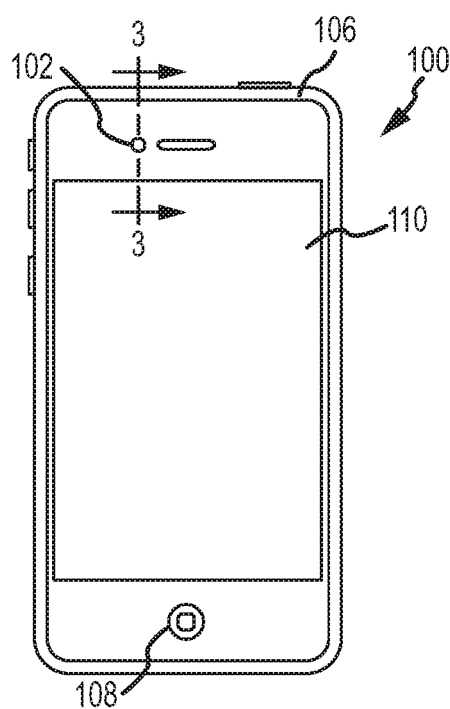
FIG. 1A is a front perspective view of an electronic device including one or more cameras.
Figure 1B:
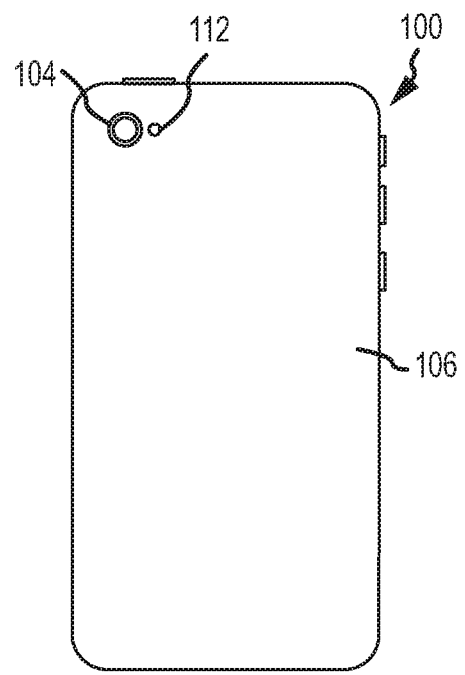
FIG. 1B is a rear perspective view of the electronic device of FIG. 1A.

Turning now to the figures, an image sensor and an illustrative electronic device for incorporating the image sensor will be discussed in more detail. FIG. 1A is a front elevation view of an electronic device 100 including one or more image sensors. FIG. 1B is a rear elevation view of the electronic device 100. The electronic device 100 may include any or all of a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on. Examples of such internal components will be discussed with respect to FIG. 2.

As shown in FIG. 1, the enclosure 106 may form an outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
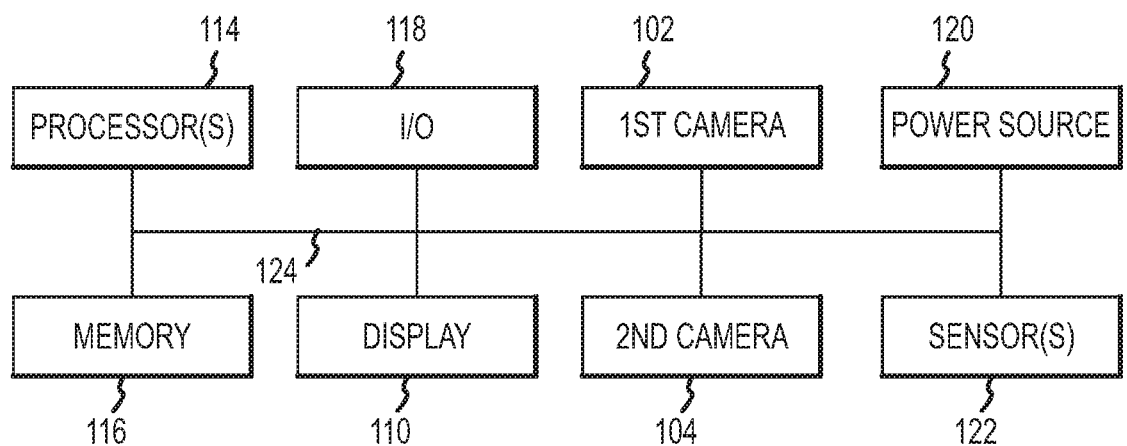
FIG. 2 is a simplified block diagram of the electronic device of FIG. 1A.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element(s).

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
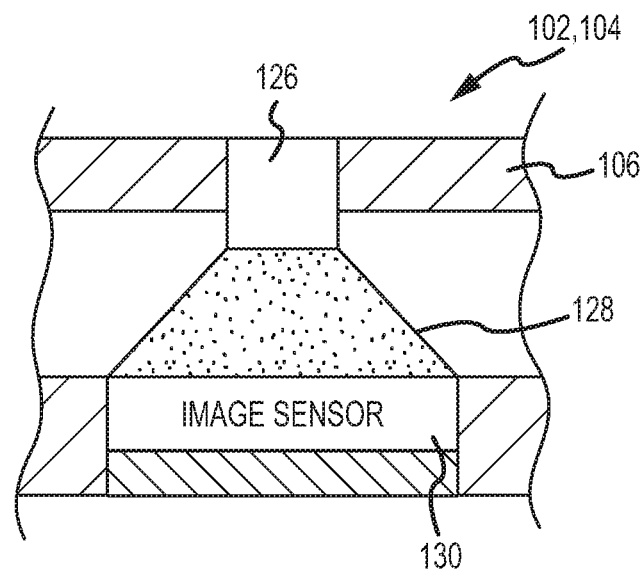
FIG. 3 is a simplified schematic cross-section view of the electronic device of FIG. 1A taken along line 3-3 in FIG. 1A.

With reference again to FIGS. 1A and 1B, the electronic device 100 may also include one or more cameras 102, 104 and optionally a flash 112 or light source for the cameras 102, 104. FIG. 3 is a simplified cross-section view of the first camera 102, taken along line 3-3 in FIG. 1A. Although FIG. 3 illustrates the first camera 102, it should be noted that the second camera 104 may be substantially similar to the first camera 102. In some embodiments, one camera may include a global shutter configured image sensor and one camera may include a rolling shutter configured image sensor. In other examples, one camera may have an image sensor with a higher resolution than the other. Likewise, it should be appreciated that the structure shown in FIG. 3 is but one possible structure for either of the first and second cameras.

With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view onto a photodiode (discussed in more detail below) of the image sensor 130. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 4A:
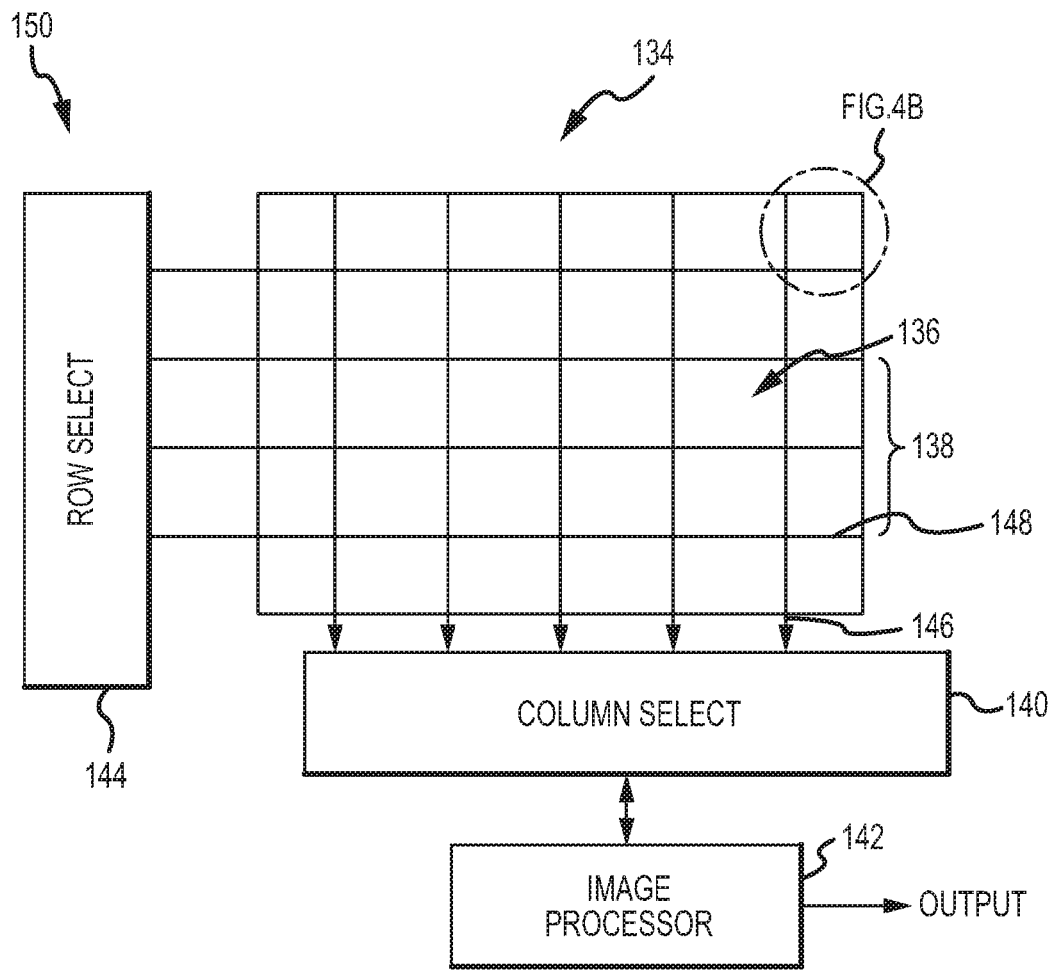
FIG. 4A is a simplified diagram of an image sensor architecture for a camera of the electronic device.
Figure 4B:
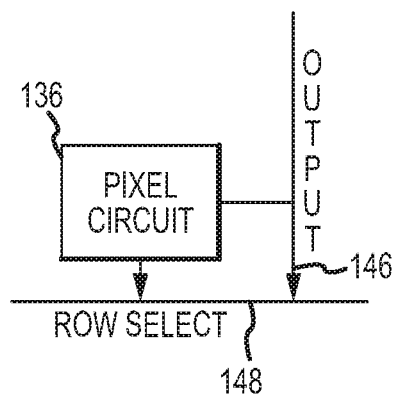
FIG. 4B is an enlarged view of a pixel architecture of FIG. 4A illustrating a single pixel.
Figure 5:
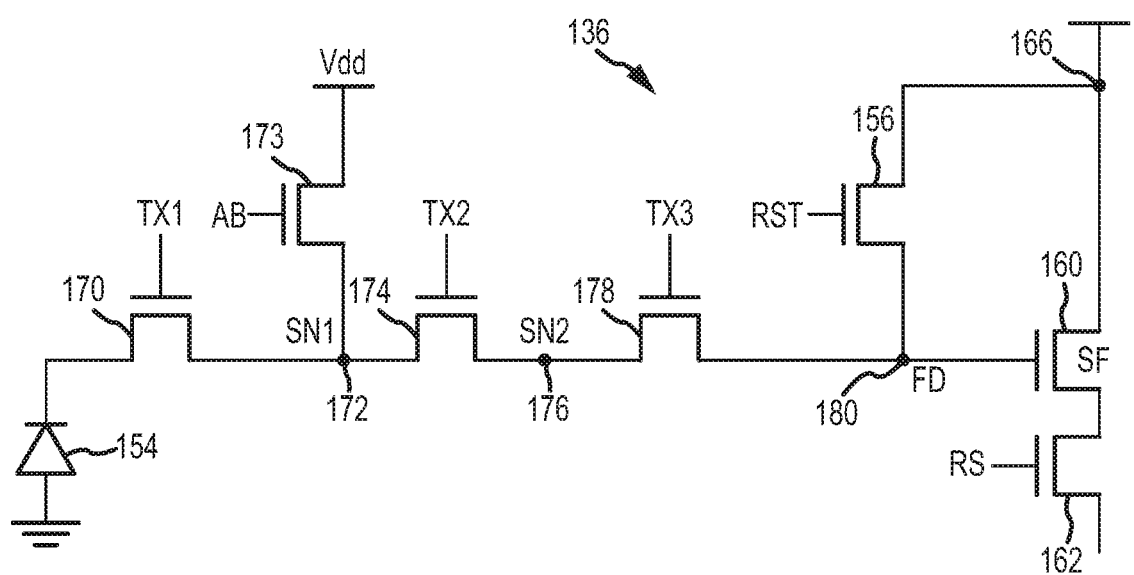
FIG. 5 is a simplified schematic view of a pixel cell.

An illustrative architecture for the image sensor 130 will now be discussed in more detail. FIG. 4A is a simplified schematic of one possible architecture for the image sensor 130. FIG. 4B is an enlarged view of a pixel of the pixel architecture of FIG. 4A. FIG. 5 is a simplified schematic view of the pixels 136 of FIG. 4A. With reference to FIGS. 4A-5, the electronic device 100 may include an image processing component having a pixel architecture defining one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to the simplified schematic of one embodiment of a pixel 136 illustrated in FIG. 5, each pixel 136 may include a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole-based photodiode. Additionally, it should be noted that the term "photodiode," as used herein, is meant to encompass substantially any type of photon or light detecting component, such as a photogate or other photo-sensitive region.

The photodiode 154 may be coupled to a first storage node SN1 172 through a first transfer gate TX1 170. The first storage node 172 may in turn be coupled to a second storage node SN2 176 through a second transfer gate TX2 174. The second storage node 176 may be coupled to a third storage node, such as a floating diffusion node FD 180 through a third transfer gate TX3 178. The storage nodes 172, 176, 180 may store charge from the photodiode 154, and may in some examples be electrically and/or optically shielded so as to prevent any stray charge and/or light form corrupting the contents of the storage nodes 172, 176, 180. The floating diffusion node 180 is provided as the gate input to a source follower gate SF 160. A row select gate 162 and the source follower gate 160 may be coupled to a reference voltage source (Vdd) node 166. The row select gate 162 may further be coupled to a row select line (e.g., 148 in FIG. 4B) for the pixel 136. The control circuitry for the pixel 136 may additionally or alternatively include one or more other gates. For example, an anti-blooming gate 173 may be coupled to the first storage node 172.

In some embodiments, the photodiode 154 and the gates 170, 173, 174, 178, 156, 160, 162 of the pixel 136 may all be positioned on a single semiconductor chip or die, whereas in other embodiments, some components of the pixel 136 may be on one semiconductor chip with other components on a second chip. For example, the photodiode 154 may be on a first semiconductor chip, with the transfer gate 170 being a vertical transfer gate coupled between the first and second semiconductor chips. The first storage node 172 may be a stack contact on the second semiconductor chip to which the vertical transfer gate 170 is coupled. In these embodiments, the second storage node 176 may be a global shutter storage node, which enables global shutter readout of the pixels 136 on the image sensor. In general, the components of the pixel 136 may be spread across one or a plurality of chips. Several examples of image sensor architecture that may be used in connection with the present disclosure are described for example in co-pending application Ser. No. 13/756,459 entitled "Vertically Stacked Image Sensor" filed on Jan. 31, 2013, the entirety of which is hereby incorporated by reference for all purposes In operation, when one of the cameras 102, 104 is actuated to capture an image, the anti-blooming gate 173 and the transfer gate 170 are turned on in order to deplete charge from the photodiode 154 and/or the storage node 172. In some embodiments, the cameras 102, 104 may not include a shutter over the lens 126, and so the image sensor 130 may be constantly exposed to light. In these embodiments, the photodiode 154 may need to be reset or depleted (e.g., via the anti-blooming gate 173) before a desired image is to be captured.

Once the photodiode 154 has been depleted, the transfer gate 170 may be turned off, thereby isolating the photodiode 154. The photodiode 154 may then begin collecting light transmitted to the image sensor 130 from the lens 126 and integrating charge derived therefrom. As the photodiode 154 receives light, it starts to collect charge generated by incident photons. The charge remains in the photodiode 154 because the transfer gate 170 connecting the photodiode 154 to the first storage node 172 is turned off. While the photodiode 154 integrates charge, the anti-blooming gate 173 may remain on in order to reset the storage node 172 and/or in order to prevent blooming from the photodiode 154.

Once integration is nearly complete, the anti-blooming gate 173 may be turned off so as to isolate the first storage node 172 (as the second transfer gate 174 is also turned off). The first transfer gate 170 may then be pulsed to a high voltage to transfer accumulated charge from the photodiode 154 to the first storage node 172. The second storage node 176 may also be reset by turning on the third transfer gate 178 and the reset gate 156 to deplete the second storage node 176.

After the charge has been transferred to the first storage node 172 and the second storage node 176 has been reset, the charge from the first storage node 172 may be transferred to the second storage node 176 through the second transfer gate 174. The charge may be transferred to the second storage node 176 through the second transfer gate 174 by several short pulses of the transfer signal TX2 provided to the second transfer gate, as described in more detail below. The charge from the photodiode 154 may be held at the second storage node 176 until the pixel 136 is ready to be read out. In the global shutter operation, each row within the pixel architecture 134 may be reset and exposed (i.e., integrate charge generated by light transmitted through the lens 126) at substantially the same time.

Once the charge has been transferred to the second storage node 176 and is ready to be read out, the reset gate 156 may be turned on to reset the floating diffusion node 180. The third transfer gate 178 may then be turned on and the charge from the second storage node 176 may be transmitted to the floating diffusion node 180. Once the charge is transferred to the floating diffusion node 180, the row select gate 162 may be activated, and the SF gate 160 amplifies the charge in the floating diffusion node 180 and provides a signal indicative thereof through the row select gate 162.

Charge Transfer Circuit

Figure 6A:
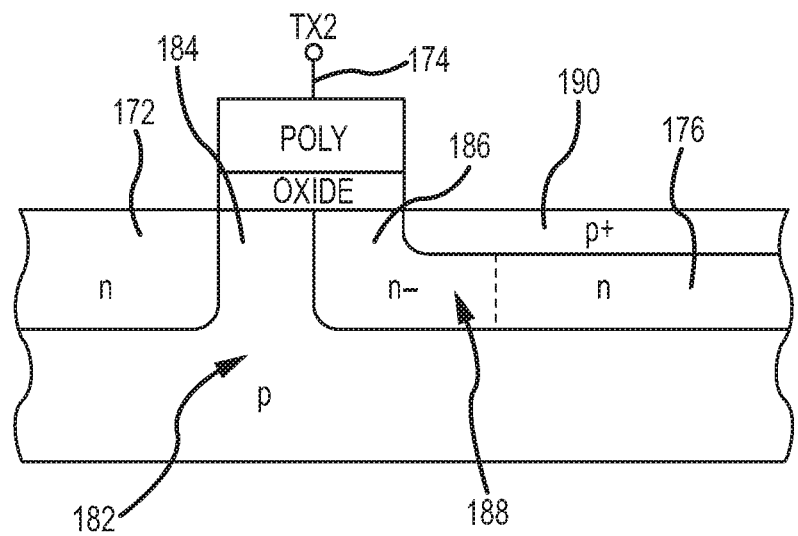
FIG. 6A is a simplified schematic cross-section view of one embodiment of a portion of an image sensor pixel.
Figure 6B:
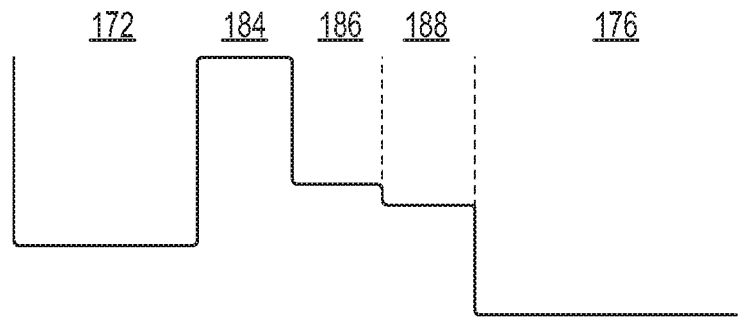
FIG. 6B is a simplified potential profile of the image sensor pixel portion shown in FIG. 6A.
Figure 6C:
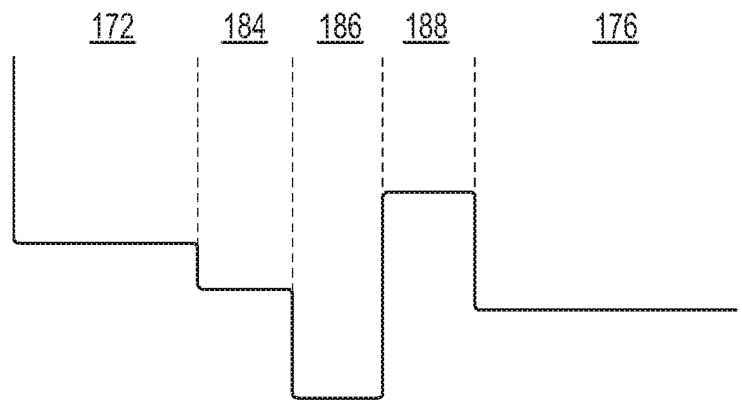
FIG. 6C is a simplified potential profile of the image sensor pixel portion shown in FIG. 6A.

FIG. 6A illustrates one embodiment of a charge transfer circuit 182 that may be used in the pixel 136, and FIGS. 6B and 6C illustrate simplified electric potential diagrams for the charge transfer circuit 182 when different transfer signals are provided to the charge transfer circuit 182. Although the charge transfer circuit 182 is illustrated in FIG. 6A and described herein as an example of how the second transfer gate 174 may be implemented, it will be understood that the charge transfer circuit 182 may alternatively or additionally be used to transfer charge between any two nodes. For example, the charge transfer circuit 182 illustrated in FIG. 6A may be used as the first transfer gate 170, the second transfer gate 174, and/or the third transfer gate 178, or in any other region of the image sensor 130 where charge needs to be transferred between two nodes. In some examples, multiple charge transfer circuits 182 may be used for a plurality of nodes in series to transfer charge therebetween, whereas in other embodiments, a single charge transfer circuit 182 may be used between a single pair of nodes.

Referring to FIG. 6A, the charge transfer circuit 182 may be coupled between first and second charge storage nodes 172, 176. In one embodiment, the two charge storage nodes 172, 176 may be n-doped regions in a p-type substrate or a p-well of a semiconductor chip. Of course, in other embodiments, different types of doping or substrate may be used.

Figure 9:
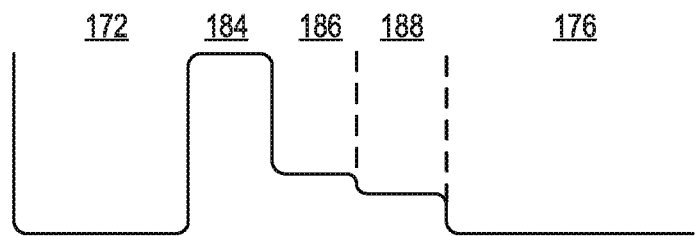
FIG. 9 is a simplified potential profile of another image sensor pixel.
Figure 10:
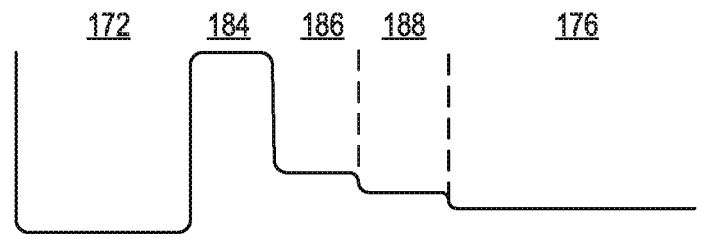
FIG. 10 is a simplified potential profile of another image sensor pixel.

The two charge storage nodes 172, 176 may have similar or different potentials. As illustrated in FIGS. 6B and 6C, the electric potential of the second storage node 176 may be slightly greater than the electric potential of the first charge storage node 172, though it may not be so much greater than the electric potential of the first charge storage node 172 that it would be able to store charge transferred from the first charge storage node 172 through a conventional transistor without sharing the charge with the first charge storage node 172. In other embodiments, however, the electric potential of the second storage node 176 may be the same as the electric potential of the first storage node 172 (see FIG. 9), or in some embodiments, the electric potential of the second charge storage node 176 may be less than the electric potential of the first charge storage node 172 (see FIG. 10).

The charge transfer circuit 182 is partitioned into two parts, a first region 184 and a second region 186. The first region 184 may be configured to have a first variable potential, and may be referred to as a variable barrier. The second region 186 may be configured to have a second variable potential, and may be referred to as a storage region. The variable potentials of both the first and second regions 184, 186 may be controlled by a transfer signal provided to the charge transfer circuit 182, for example, a transfer signal TX2 that is provided to the input node 174 or transfer gate 174 of the charge transfer circuit 182.

As illustrated in FIG. 6A, the second region 186 may be laterally offset from the first region 184, with the first region 184 being proximate one charge storage node 172, and the second region 186 being proximate the other charge storage node 176. The first and second regions 184, 186 may thus not overlap in depth beneath the transfer gate 174 in some embodiments. In other embodiments, however (not shown), the first and second regions 184, 186 may be offset from each other in depth in a silicon die, in which case each region 184, 186 may or may not extend across the entire width underneath the transfer gate 174.

Still referring to FIG. 6A, in the example where the charge transfer circuit 182 is formed in a p-well with the nodes 172, 176 being n-doped, the first region 184 may not be doped other than the p-well doping. This may cause the first region 184 to have a relatively low potential during operation of the pixel 136; hence the first region 184 may be referred to as a barrier. The second region 186, however, may be lightly n-doped, such that the second region 186 has a higher potential than the first region 184 during operation. Because the second region 186 has a higher potential than the first region, and because the second region 186 is positioned between the first region 184 and a virtual barrier 188 described in more detail below, the second region 186 may form a storage region capable of holding charge. The capacity of the second region 186 to store charge, however, may be less than the capacity of either of the nodes 172, 176 in some embodiments, and thus, as described in more detail below, the second region 186 may need to be used a plurality of times to transfer charge between the nodes 172, 176. In other words, the junction between the first and second regions 184, 186 may form a p-n junction, thus providing the capacity to store charge in the second region 186. In other embodiments, of course, other capacitive structures may be used to store charge in the second region 186.

As mentioned above, the charge transfer circuit 182 also includes an input node 174, which may be for example a transistor gate. As illustrated in FIG. 6A, the input node 174 may be a polysilicon-oxide gate structure. In other examples, the input node 174 may be a metal-oxide gate structure, or any other type of input node. Referring to the example shown in FIG. 6A, the input node 174, together with the first and second regions 184, 186, may act as a modified field-effect transistor (FET). In other examples, other types of transistors or transfer circuits may be used, such as a bipolar junction transistor. Also, referring to FIG. 6A, a single input node 174 may be used in the charge transfer circuit 182, with the input node 174 partitioned into two portions because of the different characteristics of the first and second regions 184, 186. For example, the input node 174 illustrated in FIG. 6A is a modified FET gate with two regions underneath due to the different doping profiles of the first and second regions 184, 186 of the charge transfer circuit 182. That single gate 174 may be used to change the electric potential of both the first and second regions 184, 186 responsive to a single transfer signal TX2. In this example, a relative difference between the variable electric potential of the first and second regions 184, 186 may be constant across a plurality of different transfer signal TX2 voltages. In other examples, however, a plurality of different input nodes may be used—for example, one gate may be used to control the electric potential of the first region 184, with a separate gate used to control the electric potential of the second region 186. In either event, the input node 174 (or input nodes) controls the variable potentials of the first and second regions 184, 186.

Still with reference to FIG. 6A, and as mentioned above, a virtual barrier 188 may be formed as part of the charge transfer circuit 182. The virtual barrier 188 may be formed by extending the doping of the second region 186 beyond the transfer gate 174 and underneath a pinning layer 190. In other words, the virtual barrier 188 and the second, storage region 186 may together form a commonly doped region of the charge transfer circuit 182, with the storage region 186 formed where the transfer gate 174 is positioned over the commonly doped region and the virtual barrier 188 formed where a pinned layer is positioned over the commonly doped region. In addition to facilitating the use of the second region 186 as a storage region as described above, the virtual barrier 188 may in some examples help prevent charge that is transferred to node 176 from returning to the source node 172 from which it came because the electric potential of the virtual barrier 188 is less than the electric potential of the destination node 176. This may allow the full capacity of the node 176 to be used (e.g., not just the capacity of the node 176 above the potential of the source node 172). In effect, the virtual barrier 188, together with the charge transfer circuit 182, may allow charge to be transferred to the node 176 irrespective of the potential of the node 172.

Referring now to FIGS. 6B and 6C in particular, simplified electric potential diagrams are shown for the charge transfer circuit 182. FIG. 6B illustrates the electric potential diagram for the charge transfer circuit 182 when a low voltage is provided to the input node 174, and FIG. 6C illustrates the electric potential for the charge transfer circuit 182 when a high voltage is provided to the input node 174. In both FIGS. 6B and 6C, the electric potential of the first and second charge storage nodes 172, 176, and the electric potential of the virtual barrier 188 may be fixed and may not change responsive to different transfer signals provided to the input node 174. However, the electric potentials of the first and second regions 184, 186 do change responsive to different transfer signals provided to the input node. When a low voltage is provided to the input node 174, as in FIG. 6B, the storage region 186 may have an electric potential that is slightly less than the electric potential of the virtual barrier 188 (which in turn is less than the electric potential of the second or destination node 176). The low voltage provided to the input node 174 also causes the electric potential of the first region 184 to decrease such that it is less than the electric potential of the first or source node 172. As mentioned above, because of the different doping profiles of the first and second regions 184, 186 of the charge transfer circuit 182, the electric potential of the second/storage region 186 is greater than the electric potential of the first/barrier region 184.

When a higher voltage is provided to the input node 174, as in FIG. 6C, the storage region 186 may have an electric potential that is greater than the electric potential of the virtual barrier 188, and which is also greater than the electric potential of the first region 184, thus forming a mini-well that can store a portion of charge. The low voltage provided to the input node 174 also causes the electric potential of the first region 184 to be increased above the electric potential of the first charge storage node 172 so that charge can flow into the storage region 186, as described in more detail below.

Although FIGS. 6B and 6C have illustrated one example of electric potential profiles, it will be understood that the profiles may or may not be to scale, and that the precise electric potential of any given region in an image sensor 130 will depend on the physical characteristics of that region as well as voltages or other signals that bias or deplete those regions.

Referring now to the series of illustrations in FIGS. 7A through 7G together with the timing diagram in FIG. 8 and the schematic of FIG. 5, the operation of one embodiment of the charge transfer circuit 182 will now be described for a pixel 136, wherein the charge transfer circuit of FIG. 6A is implemented as the second transfer gate 174 between the first and second storage nodes 172, 176.

As described above, to begin, the anti-blooming gate 173 and the first transfer gate 170 may be turned on in order to deplete charge from the photodiode 154 and/or the storage node 172, as illustrated at times t1 and t2, respectively. Once the charge from the photodiode 154 has been depleted, the first transfer gate 170 may be turned off at time t3, thereby isolating the photodiode. The photodiode 154 may then begin collecting light transmitted to the image sensor 130 from the lens 126 and integrating charge derived therefrom during its integration time 820$t$. While the photodiode 154 integrates charge, the anti-blooming gate 173 may remain on in order to reset the storage node 172 and/or in order to prevent blooming from the photodiode 154.

Once integration is nearly complete, the anti-blooming gate 173 may be turned off at time t4 so as to isolate the first storage node 172. The first transfer gate 170 may then be pulsed to a high voltage between times t5 and t6 to transfer accumulated charge from the photodiode 154 to the first storage node 172, as illustrated in the potential profile in FIG. 7A. Also, at time t5, the third transfer gate 178 and the reset gate 156 may be turned on to reset the second storage node 176, after which the third transfer gate 178 and the reset gate 156 may again be turned off to isolate the second storage node 176.

After the charge has been transferred to the first storage node 172 and the second storage node 176 has been reset and isolated, the charge from the first storage node 172 may be transferred to the second storage node 176 through the second transfer gate 174 by a series of pulses of the second transfer signal TX2 provided to the second transfer gate 174. At time t6, the potentials of the first and second regions 184, 186 may be increased responsive to the positive voltage TX2 provided to the input node 174, and, with reference to FIG. 7B, the increase in potential may cause charge from the first storage node 172 to be transferred (e.g., may "fall") to the storage region 186 because the electric potential of the first and second regions is increased to be greater than the electric potential of the first storage node 172. When the voltage of the second transfer signal TX2 is decreased at time t7, with reference to FIGS. 7C and 7D, the potentials of the first and second regions 184, 186 begin to decrease (FIG. 7C illustrates the potentials of the first and second regions 184, 186 when the voltage of the second transfer signal TX2 is half decreased, and FIG. 7D illustrates the potentials of the first and second regions 184, 186 when the voltage of the second transfer signal TX2 is completely decreased). In general, the electric potential of the first and second regions 184, 186 may increase and/or decrease at substantially the same time in some embodiments, and may increase and/or decrease responsive to a common transfer signal provided to a single input node 174 of the charge transfer circuit 182, or may increase and/or decrease responsive to a plurality of transfer signals provided to the charge transfer circuit 182.

When the potentials of the first and second regions 184, 186 decrease—particularly when the potential of the second region 186 decreases below the potential of the virtual barrier 188 and/or the potential of the second node 176, as illustrated in FIG. 7D—the charge stored in the second region 186 is transferred over the virtual barrier 188 and into the second charge storage node 176. Once the charge is transferred into the second charge storage node 176, the virtual barrier 188 may prevent charge from returning to the second storage region 186 and/or to the first node 172.

Figure 7A:
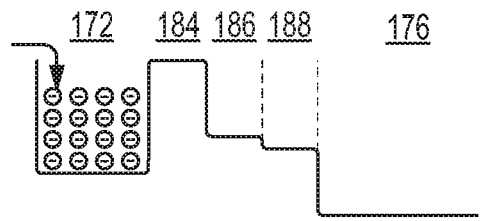
FIGS. 7A through 7G are simplified potential profiles of the image sensor pixel portion shown in FIG. 6A, illustrating its operation.
Figure 7B:
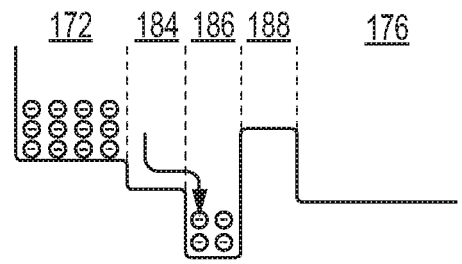
Figure 7C:
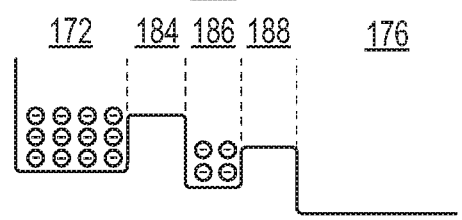
Figure 7D:
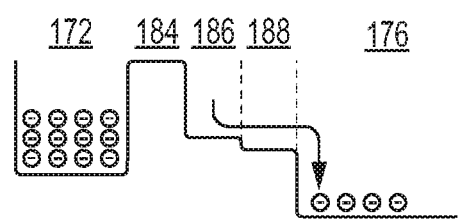
Figure 7E:
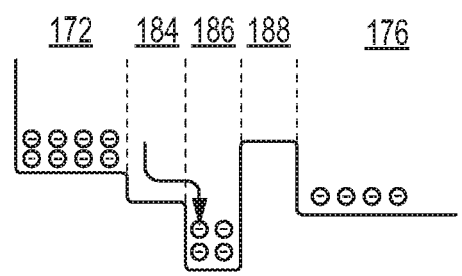
Figure 7F:
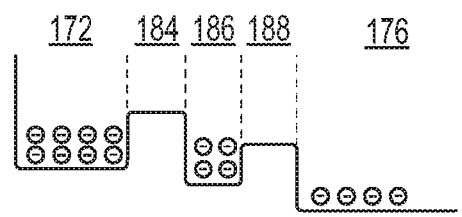
Figure 7G:
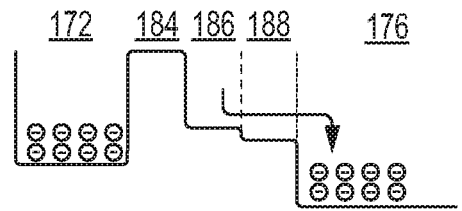

FIGS. 7E through 7G are similar to FIGS. 7B through 7D, except that some charge has already been transferred to the second node 176 in FIG. 7E. As described above, the capacity of the second region 186 to store charge may be limited such that multiple iterations of pulsing the transfer signal to the input node 174 may be required in some embodiments in order to fully transfer charge from the first node 172 to the second node 176. Therefore, the operations of increasing and decreasing the potentials of the first and second regions 184, 186 to attract charge into the second region 186, and to then dump the charge into the second node 176, may be repeated for a plurality of pulses. This pulsing of the transfer signal may be referred to as pumping, and, is somewhat similar to sending a bucket down into a well and then bringing it back up to draw up water out of the well.

Figure 8:
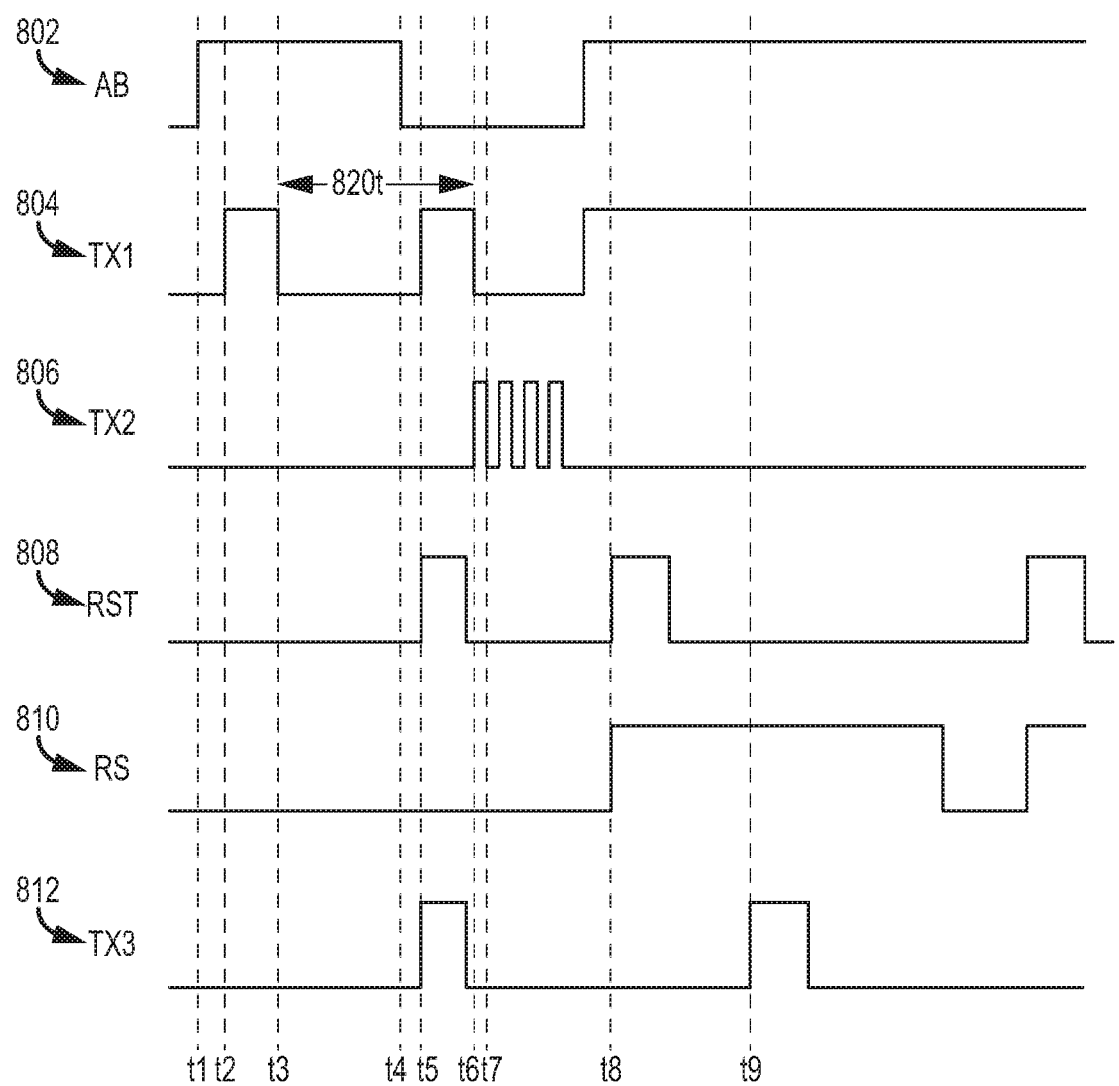
FIG. 8 is a timing diagram illustrating the operation of the image sensor pixel portion shown in FIG. 6A.

Still referring to FIG. 8, following transfer of the charge to the second charge storage node 176, the reset gate 156 may be turned on at time t8 to reset the floating diffusion node 180. The third transfer gate 178 may then be turned on at time t9 and the charge from the second storage node 176 may be transferred to the floating diffusion node 180. Once the charge is stored in the floating diffusion node 180, the row select gate 162 may be activated, and the SF gate 160 amplifies the charge in the floating diffusion node 180 and provides a signal indicative thereof through the row select gate 162.

In this manner, the embodiments of the charge transfer circuit 182 described herein do not require the electric potential of the second charge transfer node 176 to be drastically greater than the electric potential of the first charge transfer node 172, and indeed, it may even be less than the electric potential of the first charge transfer node 172. Also, by using embodiments of the charge transfer circuit 182 described herein, the entire capacity of the second or destination charge storage node 176 can be used, rather than only the capacity beyond the potential of the first or source charge storage node 172.

Conclusion

The foregoing description has broad application. For example, while examples disclosed herein may focus on particular architectures of image sensors (e.g., photodiode, global shutter, CMOS sensors, etc.), it should be appreciated that the concepts disclosed herein may equally apply to substantially any other type of image sensor with or without appropriate modifications as would be appreciated by one skilled in the art of image sensors. Moreover, although certain examples have been described with reference to particular dopants (e.g., nodes 172 and 176 in FIG. 6A are doped with n-type dopant in a p-well or on a p-substrate), it will be understood that other dopants are also within the scope of this disclosure and the appended claims. For example, referring back to FIG. 6A, the nodes 172, 176 may be doped with p-type dopant in an n-type substrate.

Furthermore, the various embodiments described herein may find application in many different implementations. Accordingly, the discussion of any embodiment is meant only to be exemplary and is not intended to suggest that the scope of the disclosure, including the claims, is limited to these examples.

What is claimed is:

1. A method of transferring charge from a first storage node to a second storage node in an integrated circuit (IC), the method comprising:
    turning off an initial transfer gate to electrically isolate a photodiode from the first storage node;
    accumulating a photon-generated charge in the photodiode during an integration time;
    applying, at a transfer gate, a first potential to a first region of the IC and to a second region of the IC, wherein:
        the first region of the IC is between the first storage node and the second region of the IC, the first region and the second region being positioned adjacent to the transfer gate;
        the first region is configured to maintain a first variable potential less than a second variable potential of the second region;
        a virtual barrier region of the IC is between the second region and the second storage node, and is configured to have a virtual barrier potential less than a potential of the second storage node; and
        the first potential causes the first variable potential to be less than a fixed potential of the first storage node;
    accumulating a quantity of charge in the first storage node by turning on the initial transfer gate and transferring at least a portion of the photon-generated charge from the photodiode to the first storage node;
    electrically isolating the first storage node from the photodiode by turning off the initial transfer gate;
    applying, at the transfer gate, a second potential to the first region and to the second region so that:

the first variable potential is greater than the fixed potential of the first storage node; and a portion of the accumulated quantity of charge in the first storage node is transferred into the second region; and applying, at the transfer gate, a third potential to the first region and to the second region so that the second variable potential is less than the virtual barrier potential and the portion of the accumulated quantity of charge is transferred from the second region into the second storage node.

2. The method of claim 1, further comprising initially depleting the first storage node of an initial charge.

3. The method of claim 1, wherein the portion of the accumulated quantity of charge is a first portion of the accumulated quantity of charge, the method further comprising applying the first, second, and third potentials so that a second portion of the accumulated quantity of charge is transferred from the first storage node into the second storage node.

4. The method of claim 3, further comprising iteratively applying the first, second, and third potentials until a final portion of the accumulated quantity of charge has been transferred to the second storage node.

5. The method of claim 1, further comprising iteratively applying the first, second, and third potentials for a fixed time period.

6. The method of claim 1, wherein the fixed potential of the first storage node is greater than the potential of the second storage node.

7. The method of claim 1, further comprising, before accumulating the photon-generated charge in the photodiode, depleting a first initial charge in the photodiode and a second initial charge in the first storage node.

8. The method of claim 1, further comprising repeatedly applying the first, second, and third potentials at the transfer gate to cause subsequent portions of the accumulated quantity of charge in the first storage node to be transferred to the second storage node.

9. The method of claim 8, wherein the first, second, and third potentials are applied until the accumulated quantity of charge in the first storage node is substantially completely transferred to the second storage node.

10. The method of claim 8, further comprising:

transferring the portions of the accumulated charge that were transferred into the second storage node to a third storage node.

11. The method of claim 10, wherein transferring the portions of the accumulated charge that were transferred into the second storage node to the third storage node includes applying a transfer signal to a third transfer gate, separate from the transfer gate and the initial transfer gate, to isolate the second storage node from the third storage node.

12. The method of claim 10, further comprising generating an output signal based on the portion of the accumulated charge that was transferred into the second storage node and was transferred to the third storage node.

* * * * *